United States Patent
Huang et al.

(10) Patent No.: US 11,414,568 B2
(45) Date of Patent: Aug. 16, 2022

(54) POLISHING COMPOSITIONS AND METHODS OF USE THEREOF

(71) Applicant: Fujifilm Electronic Materials U.S.A., Inc., N. Kingstown, RI (US)

(72) Inventors: Ting-Kai Huang, Tainan (TW); Tawei Lin, Chandler, AZ (US); Bin Hu, Chandler, AZ (US); Liqing Wen, Mesa, AZ (US); Yannan Liang, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 17/169,676

(22) Filed: Feb. 8, 2021

(65) Prior Publication Data

US 2021/0253903 A1    Aug. 19, 2021

Related U.S. Application Data

(60) Provisional application No. 62/975,828, filed on Feb. 13, 2020.

(51) Int. Cl.
| | |
|---|---|
| *C09G 1/02* | (2006.01) |
| *H01L 21/321* | (2006.01) |
| *C09K 15/30* | (2006.01) |

(52) U.S. Cl.
CPC ............. *C09G 1/02* (2013.01); *C09K 15/30* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 2003/0228763 A1* | 12/2003 | Schroeder | ........... H01L 21/3212 438/691 |
| 2014/0021400 A1 | 1/2014 | Coenjarts | |
| 2016/0068710 A1 | 3/2016 | Wang et al. | |
| 2016/0244639 A1 | 8/2016 | Li et al. | |

FOREIGN PATENT DOCUMENTS

| | | | |
|---|---|---|---|
| WO | WO 2019/131448 | 7/2019 | ........... H01L 21/304 |

OTHER PUBLICATIONS

International Search Report and Written Opinion of the International Searching Authority for International Application No. PCT/US2021/017051, dated May 24, 2021.

* cited by examiner

*Primary Examiner* — Roberts P Culbert
(74) *Attorney, Agent, or Firm* — Fish & Richardson P.C.

(57) ABSTRACT

A polishing composition includes an abrasive; a pH adjuster; a barrier film removal rate enhancer; a low-k removal rate inhibitor; an azole-containing corrosion inhibitor; and a hard mask removal rate enhancer. A method of polishing a substrate includes the steps of: applying the polishing composition described herein to a surface of a substrate, wherein the surface comprises ruthenium or a hard mask material; and bringing a pad into contact with the surface of the substrate and moving the pad in relation to the substrate.

20 Claims, No Drawings

POLISHING COMPOSITIONS AND METHODS OF USE THEREOF

CROSS-REFERENCE TO RELATED APPLICATION

The present application claims priority to U.S. Provisional Application Ser. No. 62/975,828, filed on Feb. 13, 2020, the contents of which are hereby incorporated by reference in their entirety.

BACKGROUND

The semiconductor industry is continually driven to improve chip performance by further miniaturization of devices by process, materials, and integration innovations. Earlier materials innovations included the introduction of copper, replacing aluminum as the conductive material in the interconnect structure, and the use of tantalum (Ta)/tantalum nitride (TaN) as diffusion barrier to separate the Cu conductive material from the non-conductive/insulator dielectric material. Copper (Cu) was chosen as the interconnect material because of its low resistivity and superior resistance against electro-migration.

However, as the features of newer generation chips shrink, the multilayer Cu/barrier/dielectric stacks have to be thinner and more conformal to maintain effective interconnect resistivity in Back End of Line (BEOL). The thinner Cu and the Ta/TaN barrier film schemes present problems with resistivity and flexibility in deposition. For example, with smaller dimensions and advanced manufacturing nodes, resistivity is proceeding to be exponentially worse and improvements in transistor circuit speed (at Front End of Line (FEOL)) are being cut in half by the delay coming from the conductive Cu/Barrier wiring (BEOL). Ruthenium (Ru) has emerged as a leading candidate for use as a liner material, a barrier layer, as well as a conductive layer. Ruthenium has superior anti-Cu diffusion to dielectric layers, but also can facilitate direct copper electro-filling in small dimension trenches without using a copper seed layer. Furthermore, ruthenium is also being investigated as a material for VIAs to replace conventional tungsten (W) metal.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

As defined herein, unless otherwise noted, all percentages expressed should be understood to be percentages by weight to the total weight of the chemical mechanical polishing composition.

In one aspect, embodiments disclosed herein relate to a polishing composition that includes an abrasive; a pH adjuster; a barrier film removal rate enhancer; a low-k removal rate inhibitor; an azole-containing corrosion inhibitor; and a hard mask removal rate enhancer.

In another aspect, embodiments disclosed herein relate to a polishing composition that includes an abrasive; a pH adjuster; an organic acid or a salt thereof; a nonionic surfactant; an azole-containing corrosion inhibitor; and an iron containing salt.

In yet another aspect, embodiments disclosed herein relate to a method of polishing a substrate (e.g., a substrate that includes ruthenium), including the steps of: applying the polishing composition described herein to a surface of a substrate, wherein the surface comprises ruthenium or a hard mask material; and bringing a pad into contact with the surface of the substrate and moving the pad in relation to the substrate.

Other aspects and advantages of the claimed subject matter will be apparent from the following description and the appended claims.

DETAILED DESCRIPTION

Embodiments disclosed herein relate generally to compositions and methods of using said compositions to polish substrates that include at least a ruthenium portion and/or a hard mask portion (e.g., tungsten, carbide, nitride ceramic (e.g., TiN), and doped derivatives thereof) and may, more specifically, include at least ruthenium, hard mask, and copper portions. The compositions disclosed herein can effectively remove ruthenium and/or hard mask materials while minimizing copper corrosion (e.g., minimizing surface roughness). For example, the compositions disclosed herein can be particularly useful for polishing advanced node films that include copper, a ruthenium liner, a hard mask material (e.g., titanium and doped derivatives thereof, tungsten and doped derivatives thereof (e.g., $WB_4$), carbides (e.g., BC, $B_4C$, TiC, SiC, and WC), boron-containing materials (e.g., $B_6O$, $BC_2N$, and $AlMgB_{14}$), and nitride ceramic materials (e.g., SiN, TiN, and BN), barrier materials (e.g., Ta and TaN), and dielectric materials (e.g., TEOS, low-k, ultra low-k, etc.).

Many currently available CMP slurries were specifically designed to remove materials more common in older chip designs, such as the aforementioned copper and tungsten. However, in back-end-of-line (BEOL) applications in the semiconductor industry, ruthenium is finding use as a liner material because it has favorable electrical conductivity, deposition properties, and is resistant to Cu diffusion. Unlike some other materials, such as cobalt and copper, ruthenium is relatively chemically stable and thus does not deteriorate and can be hard to remove during polishing. Further, ruthenium is often used in conjunction with copper being the conductive layer. As mentioned above, copper is a relatively soft material and thus easy to remove. Copper is essential to the function of many semiconductor devices, so if a CMP slurry is used that too easily strips away or damages copper layers or inlays, it can adversely affect the performance of the finished device. Older CMP slurries may not be able to effectively remove ruthenium without also causing deleterious and unacceptable defects in copper, since copper is more susceptible to chemical corrosion. As a result, less advanced slurries may present unacceptable corrosion, wafer topography, and/or removal rate selectivity with respect to one or more components of the multicomponent substrate to be polished. Furthermore, more complex integration schemes may use a hard mask as an etch mask in conjunction with the Ru liner and Cu conductive layer and this presents yet another material that the polishing slurry needs to be capable of effectively removing.

With the increasing use and shrinking size of multicomponent integration schemes in semiconductor fabrication, there is a market need for CMP slurries that can effectively polish a substrate that includes ruthenium, copper, and a hard mask material with minimal copper corrosion but favorable removal rates and selectivity for all other components.

In one or more embodiments, the polishing composition described herein includes an abrasive; a pH adjuster; a barrier film rate removal enhancer; a low-k removal rate inhibitor; an azole-containing corrosion inhibitor; and a hard mask removal rate enhancer. In one or more embodiments, the polishing composition can also include a chelating agent and/or an oxidizing agent. In one or more embodiments, a polishing composition according to the present disclosure can include from about 0.1% to about 50% by weight abrasive, about 0.01% to about 10% by weight pH adjuster, about 0.002% to about 4% by weight barrier film removal rate enhancer, about 0.0005% to about 5% by weight low-k removal rate inhibitor, about 0.0001% to about 1% by weight azole-containing corrosion inhibitor, about 0.0001% to about 5% by weight hard mask removal rate enhancer, and the remaining percent by weight (e.g., from about 20% to about 99% by weight) of solvent (e.g., deionized water). In one or more embodiments, the polishing composition can further include from about 0.001% to about 1% by weight chelating agent and/or from about 0.001% to about 5% by weight oxidizing agent.

In one or more embodiments, the present disclosure provides a concentrated polishing composition that can be diluted with water prior to use by up to a factor of two, or up to a factor of four, or up to a factor of six, or up to a factor of eight, or up to a factor of ten. In other embodiments, the present disclosure provides a point-of-use (POU) polishing composition for use on ruthenium containing substrates, comprising the above-described polishing composition, water, and optionally an oxidizer.

In one or more embodiments, a POU polishing composition can include from about 0.1% to about 12% by weight abrasive, about 0.01% to about 5% by weight pH adjuster, about 0.002% to about 2% by weight barrier film removal rate enhancer, about 0.0005% to about 0.5% by weight low-k removal rate inhibitor, about 0.0001% to about 0.1% by weight azole-containing corrosion inhibitor, about 0.0001% to about 0.5% by weight hard mask removal rate enhancer, optionally about 0.001% to about 5% by weight oxidizer, and about 80% to about 99% by weight of solvent (e.g., deionized water). In one or more embodiments, the POU polishing composition can further include 0.001% to 0.1% by weight chelating agent.

In one or more embodiments, a concentrated polishing composition can include from about 1% to about 50% by weight abrasive, about 0.1% to about 10% by weight pH adjuster, about 0.02% to about 4% by weight barrier film removal rate enhancer, about 0.005% to about 5% by weight low-k removal rate inhibitor, about 0.001% to about 1% by weight azole-containing corrosion inhibitor, about 0.001% to about 5% by weight hard mask removal rate enhancer, and the remaining percent by weight (e.g., from about 20% to about 98.5% by weight) of solvent (e.g., deionized water). In one or more embodiments, the concentrated polishing composition can further include from about 0.01% to about 1% by weight chelating agent.

In one or more embodiments, the polishing composition described herein can include at least one (e.g., two or three) abrasive. In some embodiments, the at least one abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In some embodiments, the at least one abrasive is high-purity, and can have less than about 100 ppm of alcohol, less than about 100 ppm of ammonia, and less than about 100 parts per billion (ppb) of an alkali cation such as sodium cation. The abrasive can be present in an amount of from about 0.1% to about 12% (e.g., from about 0.5% to about 10%) based on the total weight of the POU polishing composition, or any subranges thereof.

In some embodiments, the at least one abrasive is in an amount of from at least about 0.1% (e.g., at least about 0.5%, at least about 1%, at least about 2%, at least about 4%, at least about 5%, at least about 10%, at least about 12%, at least about 15%, or at least about 20%) by weight to at most about 50% (e.g., at most about 45%, at most about 40%, at most about 35%, at most about 30%, at most about 25%, at most about 20%, at most about 15%, at most about 12%, at most about 10%, or at most about 5%) by weight of the polishing composition described herein.

In one or more embodiments, the polishing composition described herein can include at least one (e.g., two or three) pH adjustor. In some embodiments, the at least one pH adjustor is selected from the group consisting of ammonium hydroxide, sodium hydroxide, potassium hydroxide, cesium hydroxide, monoethanolamine, diethanolamine, triethanolamine, methylethanolamine, methyldiethanolamine tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and any combinations thereof.

In some embodiments, the at least one pH adjuster is in an amount of from at least about 0.01% (e.g., at least about 0.05, at least about 0.1%, at least about 0.5%, at least about 1%, at least about 2%, at least about 4%, at least about 5%, at least about 10%, at least about 15%, or at least about 20%) by weight to at most about 10% (e.g., at most about 9%, at most about 8%, at most about 7%, at most about 6%, at most about 5%, at most about 4%, at most about 3%, at most about 2%, at most about 1%, at most about 0.5%, at most about 0.2%, or at most about 0.1%) by weight of the polishing composition described herein.

In some embodiments, the pH value of the polishing composition can range from at least about 7 (e.g., at least about 7.5, at least about 8, at least about 8.5, at least about 9, at least about 9.5, at least about 10, at least about 10.5, at least about 11, at least about 11.5, or at least about 12) to at most about 14 (e.g., at most about 13.5, at most about 13, at most about 12.5, at most about 12, at most about 11.5, at most about 11, at least about 10.5, at most about 10, at most about 9.5, or at most about 9). Without wishing to be bound by theory, it is believed that a polishing composition having a pH lower than 7 would significantly increase copper removal rate and corrosion, and a polishing composition having a pH higher than 14 can affect the stability of the suspended abrasive and would significantly increase the roughness and decrease the overall quality of a film polished by such a composition. In order to obtain the desired pH, the relative concentrations of the ingredients in the polishing compositions described herein can be adjusted.

In one or more embodiments, the polishing composition described herein can include at least one (e.g., two or three) barrier film removal rate enhancer. In some embodiments, the at least one barrier film removal rate enhancer is an organic acid (such as a carboxylic acid, an amino acid, a sulfonic acid, or a phosphonic acid) or a salt thereof. In some embodiments, the barrier film removal rate enhancer can be an acid or a salt thereof selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, salts thereof, and mixtures thereof. Without wishing to be bound by theory, it is believed that an organic acid or a salt thereof (such as those described above) can be used as an effective barrier removal rate enhancer in the polishing composition described herein to improve the removal rate of a barrier film (e.g., a Ta or TaN film) in a semiconductor substrate.

In some embodiments, the barrier film rate removal rate enhancer is in an amount of from at least about 0.002% (e.g., at least about 0.005%, at least about 0.01%, at least about 0.05%, at least about 0.1%, at least about 0.15%, at least about 0.2%, at least about 0.5%, at least about 1%, at least about 1.5%, or at least about 2%) by weight to at most about 4% (e.g., at most about 3.5%, at most about 3%, at most about 2.5%, at most about 2%, at most about 1.5%, or at most about 1%) by weight of the polishing composition described herein.

In one or more embodiments, the polishing composition described herein can include at least one (e.g., two or three) low-k removal rate inhibitor. In some embodiments, the at least one low-k removal rate inhibitor is a nonionic surfactant. In one or more embodiments, the nonionic surfactant is selected from the group consisting of alcohol alkoxylates, alkylphenol alkoxylates, tristyrylphenol alkoxylates, sorbitan ester alkoxylates, polyalkoxylates, polyalkylene oxide block copolymers, tetrahydroxy oligomers, alkoxylated diamines, and mixtures thereof. In one or more embodiments, the nonionic surfactant is a polymer having a number average molecular weight of at least about 500 g/mol, or at least about 1,000 g/mol, or at least about 2,500 g/mol, or at least about 5,000 g/mol, or at least about 7,500 g/mol, or at least about 10,000 g/mol. In one or more embodiments, the nonionic surfactant is a polymer having a number average molecular weight of at most about 1,000,000 g/mol, or at most about 750,000 g/mol, or at most about 500,000 g/mol, or at most about 250,000 g/mol, or at most about 100,000 g/mol. In one or more embodiments, the alkoxylate groups of the alkoxylated nonionic surfactants are ethoxylate, propoxylate, or a combination of ethoxylate and propoxylate groups. Without wishing to be bound by theory, it is surprising that a nonionic surfactant (such as those described above) can be used as a low-k removal rate inhibitor in the polishing composition described herein to reduce or minimize the removal rate of a low-k film (e.g., a carbon doped silicon oxide film) in a semiconductor substrate.

In some embodiments, the low-k removal rate inhibitor is in an amount of from at least about 0.0005% (e.g., at least about 0.001%, at least about 0.005%, at least about 0.01%, at least about 0.05%, at least about 0.1%, at least about 0.15%, at least about 0.2%, at least about 0.5%, at least about 1%, at least about 1.5%, at least about 2%, or at least about 3%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, at most about 0.1%, at most about 0.05%, at most about 0.01%, at most about 0.005%) by weight of the polishing composition described herein.

In one or more embodiments, the polishing composition described herein can include at least one (e.g., two or three) azole-containing corrosion inhibitor. In some embodiments, the at least one azole-containing corrosion inhibitor is selected from the group consisting of substituted or unsubstituted triazoles (e.g., 1,2,4-triazole), substituted or unsubstituted tetrazoles, substituted or unsubstituted benzotriazoles, substituted or unsubstituted pyrazoles, and substituted or unsubstituted imidazoles. In one or more embodiments, the azole-containing corrosion inhibitor can be selected from the group consisting of 1,2,4-triazole, 1,2,3-triazole, tetrazole, benzotriazole, tolyltriazole, methyl benzotriazole (e.g., 1-methyl benzotriazole, 4-methyl benzotriazole, and 5-methyl benzotriazole), ethyl benzotriazole (e.g., 1-ethyl benzotriazole), propyl benzotriazole (e.g., 1-propyl benzotriazole), butyl benzotriazole (e.g., 1-butyl benzotriazole and 5-butyl benzotriazole), pentyl benzotriazole (e.g., 1-pentyl benzotriazole), hexyl benzotriazole (e.g., 1-hexyl benzotriazole and 5-hexyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chloromethyl benzotriazole (e.g., 1-(chloromethyl)-1-H-benzotriazole), chloroethyl benzotriazole, phenyl benzotriazole, benzyl benzotriazole, aminotriazole, aminobenzimidazole, aminotetrazole, and mixtures thereof. Without wishing to be bound by theory, it is believed that an azole-containing corrosion inhibitor (such as those described above) can significantly reduce or minimize the removal rate of copper in a semiconductor substrate.

In some embodiments, the azole-containing corrosion inhibitor is in an amount of from at least about 0.0001% (e.g., at least about 0.0002%, at least about 0.0005%, at least about 0.001%, at least about 0.002%, at least about 0.005%, at least about 0.01%, at least about 0.02%, at least about 0.05%, at least about 0.1%, at least about 0.2%, or at least about 0.5%) by weight to at most about 1% (e.g., at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

In one or more embodiments, the polishing composition described herein can include at least one (e.g., two or three) hard mask removal rate enhancer. In some embodiments, the at least one hard mask removal rate enhancer is selected from the group consisting of potassium hexacyanoferrate (II), potassium hexacyanoferrate(III), ammonium iron(III) sulfate, ferric nitrate, ethylenediaminetetraacetic acid iron (III) sodium salt, iron(II) bromide, iron(III) bromide, iron(II) chloride, iron(III) chloride, iron(III) citrate, iron(II) fluoride, iron(III) fluoride, iron(II) oxalate, iron(II) perchlorate, iron (III) phosphate, iron(II) sulfate, potassium cyanide, potassium thiocyanide, thiourea, potassium tetrafluorosilicate, potassium hexafluorophosphate, potassium tetrafluoroborate, hydrofluoric acid, fluoride salts, chloric acid ($HClO_3$), chloride salts, and mixtures thereof. In some embodiments, the hard mask removal rate enhancer can be an iron containing salt. In one or more embodiments, the hard mask removal rate enhancer can be a compound that is the product of a reaction between an iron salt and a cyanide salt.

In some embodiments, the hard mask removal rate enhancer is in an amount of from about 0.0001% to about 5% by weight of the composition. In one or more embodiments, the hard mask removal rate enhancer is at least about 0.0001% (e.g., at least about 0.0002%, at least about 0.0005%, at least about 0.001%, at least about 0.002%, at least about 0.005%, at least about 0.01%, at least about 0.02%, at least about 0.05%, at least about 0.1%, at least about 0.2%, or at least about 0.5% by weight to at most about 5% (e.g., at most about 4%, at most about 3%, at most about 2%, at most about 1%, at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

In one or more embodiments, the polishing composition described herein can include at least one (e.g., two or three) optional chelating agent. In some embodiments, the at least one optional chelating agent can be an amino-containing carboxylic acid (e.g., a polyaminopolycarboxylic acid) or a phosphonic acid. In some embodiments, the chelating agent is selected from the group consisting of ethylenediaminetetraacetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, diaminocyclohexanetetraacetic acid, nitrilotrimethylphosphonic acid, ethylenediaminetetra(methylenephosphonic acid), 1-hydroxyl ethylidene-1,1-diphosphonic acid, diethylenetriamine penta (methylene phosphonic acid), and combinations thereof. Without wishing to be bound by theory, it is believed that including a chelating agent (such as those described above) in the polishing composition described herein can significantly reduce or minimize the observed defects on a semiconductor substrate (such as the defects on a surface of a copper wafer).

In some embodiments, the chelating agent is in an amount of from at least about 0.001% (e.g., at least about 0.002%, at least about 0.005%, at least about 0.01%, at least about 0.02%, at least about 0.05%, at least about 0.1%, at least about 0.2%, or at least about 0.5%) by weight to at most about 1% (e.g., at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

An optional oxidizer can be added when diluting a concentrated slurry to form a POU slurry. The oxidizer can be selected from the group consisting of hydrogen peroxide, periodic acid (e.g., orthoperiodic acid or metaperiodic acid), diperiodic acid (e.g., dimesoperiodic acid or diorthoperiodic acid), ammonium periodate, potassium periodate, sodium periodate, ammonium persulfate, iodic acid, iodate salt, perchloric acid, perchloroate salt, hydroxylamine and hydroxylamine salts, and any combinations thereof. In one or more embodiments, the oxidizer can be periodic acid (e.g., orthoperiodic acid or metaperiodic acid).

In some embodiments, the oxidizer is in an amount of from at least about 0.001% (e.g., at least about 0.002%, at least about 0.005%, at least about 0.01%, at least about 0.02%, at least about 0.04%, at least about 0.05%, at least about 0.075%, at least about 0.1%, at least about 0.25%, at least about 0.5%, at least about 0.75%, at least about 1%, at least about 1.25%, at least about 1.5%, or at least about 2%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, or at most about 0.1%) by weight of the polishing composition described herein. In some embodiments, without wishing to be bound by theory, it is believed that the oxidizer can help remove ruthenium in a ruthenium containing substrate.

In some embodiments, the polishing composition described herein can include a solvent (e.g., a primary solvent), such as water. In some embodiments, the solvent (e.g., water) is in an amount of from at least about 20% (e.g., at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 92%, at least about 94%, at least about 95%, or at least about 97%) by weight to at most about 99% (e.g., at most about 98%, at most about 96%, at most about 94%, at most about 92%, at most about 90%, at most about 85%, at most about 80%, at most about 75%, at most about 70%, or at most about 65%) by weight of the polishing composition described herein.

In one or more embodiments, an optional secondary solvent (e.g., an organic solvent) can be used in the polish composition (e.g., the POU or concentrated polishing composition) of the present disclosure, which can help with the dissolution of the azole-containing corrosion inhibitor. In one or more embodiments, the secondary solvent can be one or more alcohols, alkylene glycols, or alkylene glycol ethers. In one or more embodiments, the secondary solvent comprises one or more solvents selected from the group consisting of ethanol, 1-propanol, 2-propanol, n-butanol, propylene glycol, 2-methoxyethanol, 2-ethoxyethanol, propylene glycol propyl ether, dimethyl sulfoxide, and ethylene glycol.

In some embodiments, the secondary solvent is in an amount of from at least about 0.0025% (e.g., at least about 0.005%, at least about 0.01%, at least about 0.02%, at least about 0.05%, at least about 0.1%, at least about 0.2%, at least about 0.4%, at least about 0.6%, at least about 0.8%, or at least about 1%) by weight to at most about 5% (e.g., at most about 4%, at most about 3%, at most about 2%, at most about 1%, at most about 0.8%, at most about 0.6%, at most about 0.5%, or at most about 0.1%) by weight of the polishing composition described herein.

In one or more embodiments, the polishing composition described herein can be substantially free of one or more of certain ingredients, such as organic solvents, pH adjusting agents, quaternary ammonium compounds (e.g., salts or hydroxides), amines, alkali bases (such as alkali hydroxides), fluoride containing compounds, silicon-containing compounds such as silanes (e.g., alkoxysilanes), imines (e.g., amidines such as 1,8-diazabicyclo[5.4.0]-7-undecene (DBU) and 1,5-diazabicyclo[4.3.0]non-5-ene (DBN)), salts (e.g., halide salts or metal salts), polymers (e.g., cationic or anionic polymers), surfactants (e.g., cationic surfactants, anionic surfactants, or non-ionic surfactants), plasticizers, oxidizing agents (e.g., $H_2O_2$), corrosion inhibitors (e.g., azole or non-azole corrosion inhibitors), and/or certain abrasives (e.g., ceria abrasives, non-ionic abrasives, surface modified abrasives, or negatively/positively charged abrasive). The halide salts that can be excluded from the polishing compositions include alkali metal halides (e.g., sodium halides or potassium halides) or ammonium halides (e.g., ammonium chloride), and can be chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing composition described herein can be completely free of one or more of the above ingredients.

In one or more embodiments, the polishing composition described herein can have a selectivity (or a ratio) of hard mask removal rate to silicon oxides (e.g., TEOS) removal rate of at least about 0.25:1 (e.g., at least about 0.5:1, at least about 0.75:1, at least about 1:1, at least about 1.25:1, at least about 1.5:1, at least about 1.75:1, at least about 2:1, at least about 2.25:1, at least about 2.5:1, at least about 2.75:1, at least about 3:1, at least about 3.25:1, at least about 3.5:1, or at least about 4:1) or at most about 100:1 (e.g., at most about 50:1 or at most about 10:1). In one or more embodiments, the polishing composition described herein can selectively remove hard mask over silicon oxide (e.g., having a hard mask removal rate higher than the silicon oxide removal rate). It is to be noted that the term "silicon oxide" described herein is expressly intended to include both un-doped and doped versions of silicon oxide. For example, in one or more embodiments, the silicon oxide can be doped with at least one dopant selected from carbon, nitrogen, oxygen, hydrogen, or any other known dopants for silicon oxide. Some examples of silicon oxide film types include TEOS (tetraethyl orthosilicate), SiOC, SiOCN, SiOCH, SiOH and SiON.

The present disclosure also contemplates a method of using any of the above-described polishing compositions (e.g., concentrates or POU slurries). With the concentrate, the method can comprise the steps of diluting the concentrate to form a POU slurry (e.g., by a factor of at least two), and then contacting a surface at least partially comprising ruthenium and a hard mask material with the POU slurry. In some embodiments, an oxidizer can be added to the slurry before, after, or during the dilution. With the POU slurry, the method comprises the step of contacting a surface at least partially comprising ruthenium and a hard mask material with the slurry.

In one or more embodiments, this disclosure features a polishing method that can include applying a polishing composition according to the present disclosure to a substrate (e.g., a wafer) having at least ruthenium and a hard mask material on a surface of the substrate; and bringing a pad into contact with the surface of the substrate and moving the pad in relation to the substrate. In some embodiments, when the substrate includes at least one or more of silicon oxides, ruthenium, hard mask materials and/or barrier materials (e.g., Ta, TaN), the above method can effectively polish the substrate (e.g., removing at least a portion of the silicon oxides, ruthenium, copper, hard mask materials and/or barrier materials) without significant corrosion (e.g., copper corrosion) or undesirable removal rate selectivity. In one or more embodiments, the copper removal rate is less than about 100 Å/min, or less than about 90 Å/min, or less than about 80 Å/min, or less than about 70 Å/min, or less than about 60 Å/min, or less than about 50 Å/min. In one or more embodiments, the static etch rate (SER) for a copper coupon incubated with a polishing composition according to the present disclosure is less than about 2.5 Å/min. In one or more embodiments, the hard mask removal rate is at least about 50 Å/min, or at least about 75 ∈/min, or at least about 100 Å/min, or at least about 125 Å/min, or at least about 150 Å/min, or at least about 200 Å/min. In one or more embodiments, the ratio of the ruthenium polishing rate to the copper polishing rate (Ru:Cu) is at most about 5:1, or at most about 4:1, or at most about 3:1, or at most about 2:1, or at most about 1:1.

In some embodiments, the method that uses a polishing composition described herein can further include producing a semiconductor device from the substrate treated by the polishing composition through one or more steps. For example, photolithography, ion implantation, dry/wet etching, plasma etching, deposition (e.g., PVD, CVD, ALD, ECD), wafer mounting, die cutting, packaging, and testing can be used to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present invention to its fullest extent.

EXAMPLES

In these examples, the polishing was performed on two polishing systems. One polishing system performed polishing on 300 mm wafers, using an Ebara CMP polisher, a Fujibo soft pad, a downforce pressure of 105 hPa, and a slurry flow rate between 100 and 500 mL/min. The second polishing system performed polishing on 200 mm wafers, using an AMAT Mirra CMP polisher, a Fujibo soft pad, a downforce pressure of 1.5 psi, and a slurry flow rate between 100 and 400 mL/min.

The general compositions used in the examples below are shown in Table 1 below. The specifics details on the differences in the compositions tested will be explained in further detail when discussing the respective examples.

TABLE 1

| Component | % By Weight of Composition |
|---|---|
| pH adjuster (base) | 0.05-5 |
| Barrier Film Removal Rate Enhancer (Organic Acid) | 0.02-2 |
| Low-k Removal Rate Inhibitor | 0.01-1 |
| Azole-Containing Corrosion Inhibitor | 0.0001-0.1 (if used) |
| Hard Mask Removal Enhancer | 0.0001-1 (if used) |
| Abrasive (silica) | 0.1-12 |
| Oxidizer (H5IO6) | 0.01-5 |
| Solvent (DI Water) | 80-99 |
| pH | 7-12 |

Example 1

Table 2 below shows the removal rate for TEOS, tungsten doped carbide hard mask (HM), Ru, and Cu blanket wafers when polished using Composition 1-4. Compositions 1-4 contained the same ingredients at the same concentrations except for the differences identified below and in Table 2.

Composition 1 included a Cu removal rate inhibitor (Cu RRI-1), which is an azole containing corrosion inhibitor. Each of Compositions 2-3 included a hard mask removal rate enhancer (HM RRE) at the same concentration and an abrasive at different concentrations, as shown in Table 2. Composition 4 included both the HM RRE and the Cu RRI-1.

The results showed surprisingly that the addition of the HM RRE increased the HM removal rate, while maintaining the Ru removal rate. Further, the selectivity of HM to TEOS removal rate was modulated to favor removal of the HM by reducing the amount of abrasive used.

silica, titania, ceria, zirconia, co-formed products of alumina, silica, titania, ceria, or zirconia, coated abrasives, surface modified abrasives, and mixtures thereof.

TABLE 2

|  | Como. 1<br>0.35 Cu RRI-1 +<br>2x Abrasive | Comp. 2<br>1x HM RRE +<br>1x Abrasive | Comp. 3<br>1x HM RRE +<br>0.5x Abrasive | Comp. 4<br>0.35x Cu RRI-1 +<br>2x HM RRE +<br>0.5x Abrasive |
|---|---|---|---|---|
| TEOS RR (Å/min) | 350 | 100 | 50 | 46 |
| HM RR (Å/min) | 100 | 220 | 180 | 168 |
| HM/TEOS Selectivity | 0.29 | 2.2 | 3.6 | 3.7 |
| Ru RR (Å/min) | 160 | 158 | 150 | 159 |
| Cu RR (Å/min) | 41 | 50 | 62 | 73 |

RR = removal rate

Example 2

Table 3 below shows measurements of roughness on Cu blanket wafers after polishing with the indicated compositions. Ra, Rq, and Rz represent a roughness average, root mean square roughness, and average maximum height of the profile, respectively.

Compositions 5-7 contained the same ingredients at the same concentrations except for the differences identified below and in Table 3. Composition 5 included only one azole containing corrosion inhibitor (i.e., the Cu RRI). Compositions 6 and 7 included two azole containing corrosions inhibitors (i.e., the Cu RRI-1 and the Cu RRI-2).

The combination of the two distinct azole containing compounds (Cu RRI-1 and Cu RRI-2) reduced the Cu roughness observed after polishing.

TABLE 3

|  | Comp. 5<br>4x Cu RRI-1 | Comp. 6<br>5x Cu RRI-1 +<br>1x Cu RRI-2 | Comp. 7<br>5x Cu RRI-1 +<br>2x Cu RRI-2 |
|---|---|---|---|
| Ra (nm) | 0.43 | 0.33 | 0.24 |
| Rq (nm) | 0.51 | 0.42 | 0.31 |
| Rz (nm) | 2.47 | 2.07 | 1.69 |

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A polishing composition, comprising:
   an abrasive;
   a pH adjuster;
   a barrier film removal rate enhancer;
   a low-k removal rate inhibitor;
   an azole-containing corrosion inhibitor; and
   a hard mask removal rate enhancer selected from the group consisting of potassium hexacyanoferrate(II), iron(II) bromide, iron(II) chloride, iron(II) fluoride, iron(II) oxalate, iron(II) perchlorate, iron(II) sulfate, potassium thiocyanide, thiourea, potassium tetrafluorosilicate, potassium hexafluorophosphate, potassium tetrafluoroborate, hydrofluoric acid, chloric acid, and mixtures thereof.

2. The polishing composition of claim 1, wherein the abrasive is selected from the group consisting of alumina, 3. The polishing composition of claim 1, wherein the abrasive is in an amount of from about 0.1% to about 50% by weight of the composition.

4. The polishing composition of claim 1, wherein the barrier film removal rate enhancer is an organic acid or a salt thereof selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, potassium acetate, potassium citrate, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, salts thereof, and mixtures thereof.

5. The polishing composition of claim 1, wherein the barrier film removal rate enhancer is in an amount of from about 0.002% to about 4% by weight of the composition.

6. The polishing composition of claim 1, wherein the low-k removal rate inhibitor is a nonionic surfactant.

7. The polishing composition of claim 6, where the nonionic surfactant is selected from the group consisting of alcohol alkoxylates, alkylphenol alkoxylates, tristyrylphenol alkoxylates, sorbitan ester alkoxylates, polyalkoxylates, polyalkylene oxide block copolymers, tetrahydroxy oligomers, alkoxylated diamines, and mixtures thereof.

8. The polishing composition of claim 1, wherein the low-k removal rate inhibitor is in an amount of from about 0.0005% to about 5% by weight of the composition.

9. The polishing composition of claim 1, wherein the azole-containing corrosion inhibitor is selected from the group consisting of triazole, 1,2,4-triazole, tetrazole, benzotriazole, tolyltriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, and mixtures thereof.

10. The polishing composition of claim 1, wherein the azole-containing corrosion inhibitor is in an amount of from about 0.0001% to about 1% by weight of the composition.

11. The polishing composition of claim 1, wherein the pH adjustor is selected from the group consisting of ammonium hydroxide, sodium hydroxide, potassium hydroxide, cesium hydroxide, monoethanolamine, diethanolamine, triethanolamine, methylethanolamine, methyldiethanolamine tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropyl ammonium hydroxide, benzyltrimethylammonium hydroxide, tris(2-hydroxyethyl)methylammonium hydroxide, choline hydroxide, and any combinations thereof.

12. The polishing composition of claim 1, wherein the pH adjustor is in an amount of from about 0.01% to about 10% by weight of the composition.

13. The polishing composition of claim 1, wherein the hard mask removal rate enhancer is in an amount of from about 0.0001% to about 5% by weight of the composition.

14. The polishing composition of claim 1, further comprising:
a chelating agent selected from the group consisting of ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, diaminocycloheanetetraacetic acid, nitrilotrimethylphosphonic acid, ethylenediaminetetra(methylenephosphonic acid), 1-hydroxyl ethylidene-1,1-diphosphonic acid, diethylenetriamine penta (methylene phosphonic acid), and combinations thereof.

15. The polishing composition of claim 14, wherein the chelating agent is in an amount of from about 0.001% to about 1% by weight of the composition.

16. The polishing composition of claim 1, further comprising an oxidizing agent selected from the group consisting of hydrogen peroxide, orthoperiodic acid, metaperiodic acid, dimesoperiodic acid, diorthoperiodic acid, ammonium periodate, potassium periodate, sodium periodate, ammonium persulfate, iodic acid, iodate salts, perchloric acid, perchloroate salts, hydroxylamine and hydroxylamine salts, and any combinations thereof.

17. The polishing composition of claim 1, wherein the composition comprises:

the abrasive in an amount of from about 0.1% to about 50% by weight of the composition;
the pH adjuster in an amount of from about 0.01% to about 10% by weight of the composition;
the barrier film removal rate enhancer in an amount of from about 0.002% to about 4% by weight of the composition;
the low-k removal rate inhibitor in an amount of from about 0.0005% to about 5% by weight of the composition;
the azole-containing corrosion inhibitor in an amount of from about 0.0001% to about 1% by weight of the composition; and
the hard mask removal rate enhancer in an amount of from about 0.0001% to about 5% by weight of the composition.

18. The polishing composition of claim 1, wherein the pH of the composition is between about 7 and about 14.

19. A polishing composition, comprising:
an abrasive;
a pH adjuster;
an organic acid or a salt thereof;
a nonionic surfactant;
an azole-containing corrosion inhibitor; and
an iron(II) containing salt.

20. A method of polishing a substrate, comprising the steps of:
applying the polishing composition of claim 1 to a surface of a substrate, wherein the surface comprises ruthenium or a hard mask material; and
bringing a pad into contact with the surface of the substrate and moving the pad in relation to the substrate.

* * * * *

UNITED STATES PATENT AND TRADEMARK OFFICE
CERTIFICATE OF CORRECTION

PATENT NO. : 11,414,568 B2
APPLICATION NO. : 17/169676
DATED : August 16, 2022
INVENTOR(S) : Ting-Kai Huang et al.

It is certified that error appears in the above-identified patent and that said Letters Patent is hereby corrected as shown below:

In the Specification

Column 7
Lines 20-21: delete "ethylenediaminetetracetic" and insert -- ethylenediaminetetraacetic --
Lines 22-23: delete "diethylenetriaminepentacetic" and insert -- diethylenetriaminepentaacetic --
Lines 24-25: delete "diaminocycloheanetetraacetic" and insert -- diaminocyclohexanetetraacetic --
Line 52: delete "perchloroate" and insert -- perchlorate --

In the Claims

Columns 12-13
Line 67 (Column 12) and Line 1 (Column 13), in Claim 11: delete "dimethyldipropyl ammonium" and insert -- dimethyldipropylammonium --

Column 13
Line 13, in Claim 14: delete "ethylenediaminetetracetic" and insert -- ethylenediaminetetraacetic --
Line 15, in Claim 14: delete "diethylenetriaminepentacetic" and insert
-- diethylenetriaminepentaacetic --
Lines 17-18, in Claim 14: delete "diaminocycloheanetetraacetic" and insert
-- diaminocyclohexanetetraacetic --
Line 32, in Claim 16: delete "perchloroate" and insert -- perchlorate --

Signed and Sealed this
Twenty-fifth Day of October, 2022

Katherine Kelly Vidal
*Director of the United States Patent and Trademark Office*